United States Patent

Chen et al.

[11] Patent Number: 6,146,971
[45] Date of Patent: Nov. 14, 2000

[54] PROCESS FOR FORMING A SHALLOW TRENCH ISOLATION STRUCTURE

[75] Inventors: Chun-Lung Chen, Tainan Hsien; Hsi-Mao Hsiao, Hsinchu; Hung-Chen Yu, Yi-Lan Hsien; Tzung-Han Lee, Taipei, all of Taiwan

[73] Assignee: United Microelectronics Corp, Hsinchu, Taiwan

[21] Appl. No.: 09/491,574

[22] Filed: Jan. 26, 2000

[30] Foreign Application Priority Data

Dec. 16, 1999 [TW] Taiwan ................... 088122141

[51] Int. Cl.⁷ .................................. H01L 21/76
[52] U.S. Cl. ................. 438/424; 438/427; 438/695
[58] Field of Search ........................ 438/424, 427, 438/435, 437, 695

[56] References Cited

U.S. PATENT DOCUMENTS

| | | |
|---|---|---|
| 5,728,621 | 3/1998 | Zheng et al. ............ 438/427 |
| 5,880,007 | 3/1999 | Varian et al. ........... 438/427 |
| 5,981,355 | 11/1999 | Lee ........................ 438/424 |
| 5,998,279 | 12/1999 | Liaw ....................... 438/424 |

*Primary Examiner*—Trung Dang
*Attorney, Agent, or Firm*—J.C. Patents; Jiawei Huang

[57] ABSTRACT

A method is used to form a shallow trench isolation structure. According to the invention, prior to performing CMP on a HDPCVD oxide layer, a smoothing step is performed on the HDPCVD oxide layer to smooth the peak profile of the oxide layer to reduce the moment resulting from the CMP on the peak, and to prevent the later-formed shallow trench isolation structure from being pulled out. In addition, since the invention prevents the later-formed shallow trench isolation structure from being pulled out, the particles resulting from the oxide pulled out from the shallow trench are reduced. Thus, particle damage to the surface of the wafer is reduced.

7 Claims, 4 Drawing Sheets

6,146,971

PROCESS FOR FORMING A SHALLOW TRENCH ISOLATION STRUCTURE

CROSS-REFERENCE TO RELATED APPLICATION

This application claims the priority benefit of Taiwan application serial no. 88122141, filed Dec. 16, 1999.

BACKGROUND OF THE INVENTION

1. Field of the Invention

The present invention relates to a process for forming the device isolation structure of an integrated circuit (IC). More particularly, the present invention relates to a process for forming a shallow trench isolation (STI) structure.

2. Description of the Related Art

A complete integrated circuit usually consists of millions of metal-oxide-semiconductor (MOS) transistors. To prevent any two neighbouring transistors from short-circuiting, some isolating structures need to be formed. Conventionally, a field oxide (FOX) layer is formed around devices by local oxidation (LOCOS). However, due to the many side effects related to the use of an oxide layer such as internal stress and bird's beak encroachment problem, field oxide isolation has been gradually replaced by shallow trench isolation (STI) structures. In fact, as the critical dimensions (CDs) of devices continues to decrease reaching the deep submicron range, STI structures become the principle means of isolating MOS transistors.

FIGS. 1A through 1E are schematic cross-sectional views showing a process for forming a STI structure according to the prior art. In FIG. 1A, a semiconductor substrate 10 is provided, and a pad oxide layer 12 and a mask layer 14 are subsequently formed thereon. The pad oxide layer 12 is formed by thermal oxidation.

As shown in FIG. 1B, a conventional photolithography and etching process is performed to define the pad oxide layer 12 and the mask layer 14 into a pad oxide layer 12a and a mask layer 14a and to form a shallow trench 15 in the substrate 10. Then, a thermal oxidation process is performed to form a liner oxide layer 16.

As shown in FIG. 1C, an oxide layer 18 is formed by high density plasma chemical vapor deposition (HDPCVD) to cover the substrate 10 and to fill the trench 15. However, the oxide layer 18 formed by the HDPCVD has a peak profile comprising steep peaks 18a. Thus, when a subsequent chemical mechanical polishing is performed to planarize the oxide layer 18, the steep peak 18a encounters a high moment induced by a shear force during the chemical mechanical polishing. As a result, the portion 18b (the shaded part) of the oxide layer 18 in the trench 15 can be pulled out and a defect 19 results, as shown in FIG. 1D. In addition, the pulled-out portion 18b can become particles on the surface of the wafer while performing the chemical mechanical polishing; these particles can damage the surface of the wafer.

Referring to FIG. 1E, the mask layer 14a and the pad oxide layer 12a are removed by wet etching to complete shallow trench isolation structures. However, if the defect 19 exists, there is no isolation structure in some shallow trenches. This lack of isolation structure will seriously affect the operation of the device.

SUMMARY OF THE INVENTION

According to above, the invention provides a process for forming a shallow trench isolation structure. According to the invention, in a planarization process, before performing a chemical mechanical polishing (CMP) on a high density plasma chemical vapor deposition (HDPCVD) oxide layer, a smoothing step is performed on the HDPCVD oxide layer to smooth the peak profile of the oxide layer in order to reduce the moment resulting from the CMP on the peak and to prevent the later-formed shallow trench isolation structure from being pulled out. Furthermore, since the invention prevents the later-formed shallow trench isolation structure from being pulled out, the particle resulting from the oxide pulled out from the shallow trench is reduced. Thus, a particle damage on the surface of the wafer is reduced.

According to the invention, the process for forming a shallow trench isolation structure comprises the following steps.

A semiconductor substrate is provided. A pad oxide layer and a mask layer are formed on the semiconductor substrate. The mask layer, the pad oxide layer and the semiconductor substrate are defined to form a shallow trench in the semiconductor substrate. A liner oxide layer is formed on the surface of the semiconductor substrate in the shallow trench. An oxide layer is formed to cover the semiconductor substrate and to fill the shallow trench. A smoothing step is performed to smooth the profile of the oxide layer. A chemical mechanical polishing is performed to planarize the oxide layer. The mask layer and the pad oxide layer are removed to complete a shallow trench isolation structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 2A through FIG. 2F are schematic, cross-sectional views showing a process for forming a shallow trench isolation structure according to a preferred embodiment of the invention.

Figure 1A:
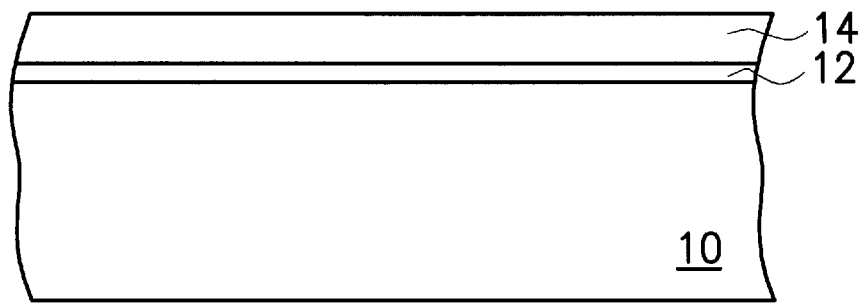
FIG. 1A through FIG. 1E are schematic, cross-sectional views showing a process for forming a shallow trench isolation structure according to the prior art.
Figure 1B:
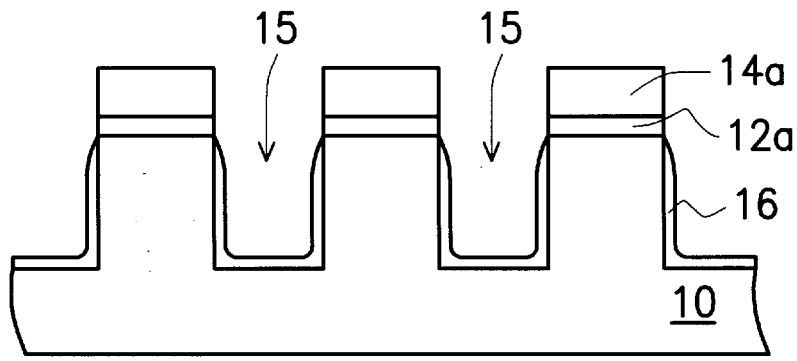
Figure 1C:
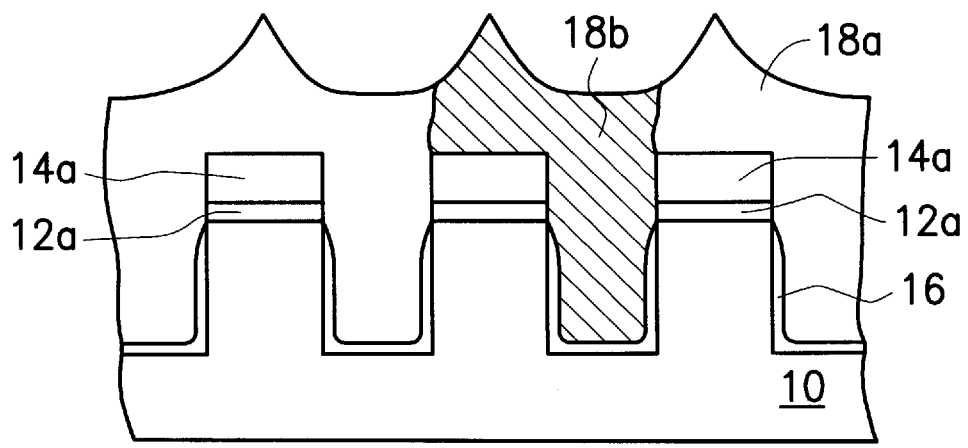
Figure 1D:
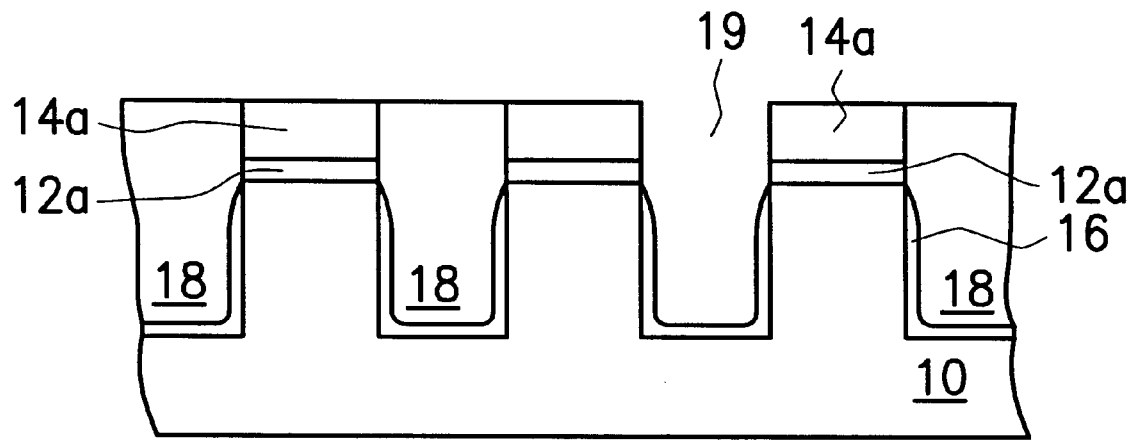
Figure 1E:
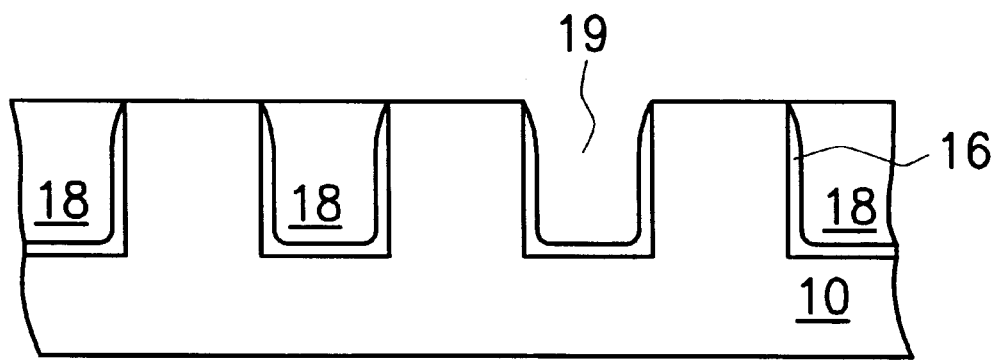
Figure 2A:
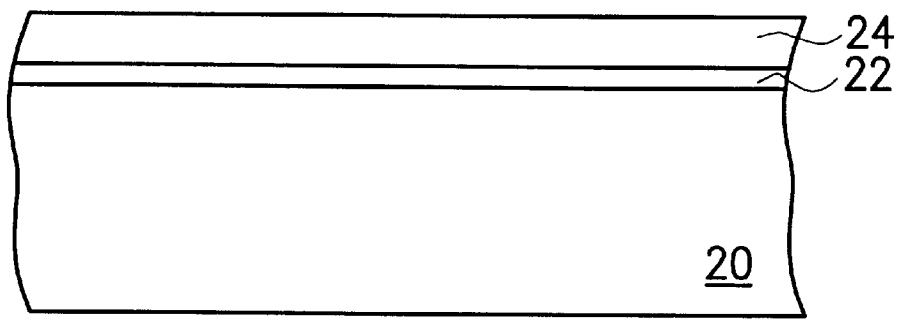
FIG. 2A through FIG. 2F are schematic, cross-sectional views showing a process for forming a shallow trench isolation structure according to a preferred embodiment of the invention.

Referring to FIG. 2A, a pad oxide layer 22 and a mask layer 24 are subsequently formed on a semiconductor substrate 20. The pad oxide layer 22 is, for example, formed to a thickness of about 100–300 Å by thermal oxidation, and the mask layer 24 is, for example, a silicon nitride layer having a thickness of about 1500–2000 Å and is formed by chemical vapor deposition.

Figure 2B:
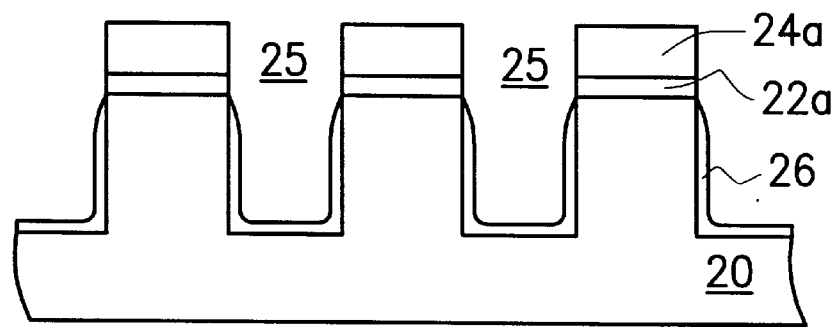

Referring to FIG. 2B, the mask layer 24, the pad oxide layer 22 and the semiconductor substrate 20 are patterned into a mask layer 24a, a pad oxide layer 22a and a shallow trench 25 by a photolithography and etching process. The depth of the trench 25 is about 3000–5000 Å. A liner oxide layer 26 is formed on the surface of the semiconductor substrate 20 in the trench 25 by, for example, thermal oxidation. The thickness of the liner oxide layer 26 is about 100–150 Å.

Figure 2C:
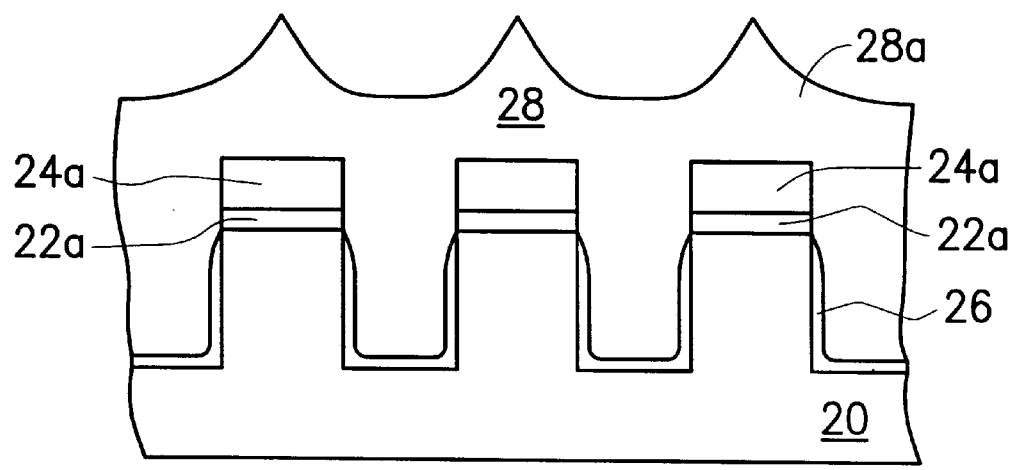
Figure 2D:
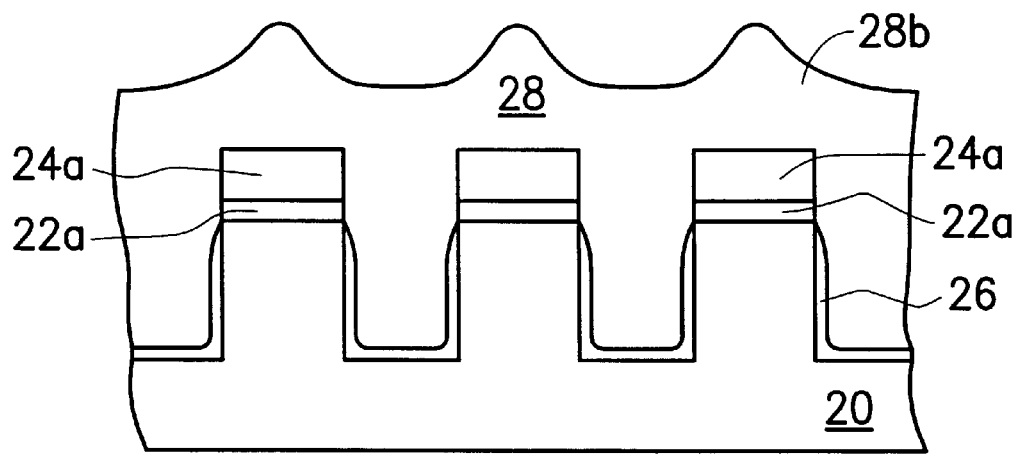

Referring to FIG. 2C, an oxide layer 28 is formed to cover the semiconductor substrate 20 and to fill the shallow trench 25 by high density plasma chemical vapor deposition wherein the oxide layer 28 has a peak profile comprising steep peaks 28a.

In order to prevent the steep peaks 28a from encountering a high shear force during chemical mechanical polishing, a smoothing step is performed to smooth the oxide layer 28; thus, the steep peaks 28a can be smoothed into gentle peaks 28b. The profile of the oxide layer 28 becomes smoother.

The smoothing step is, for example, a wet etching step or an isotropic dry etching step. The wet etching step comprises using a buffered oxide etchant (BOE) or dilute hydrogen fluoride (HF). The isotropic dry etching step comprises chemical dry etching. Operation conditions for the chemical dry etching are a chamber pressure of about 1000 mT, a tetrafluoromethane ($CF_4$) flow rate of about 200 sccm, an oxygen ($O_2$) flow rate of about 200 sccm, and a power of about 1400 W.

Figure 2E:
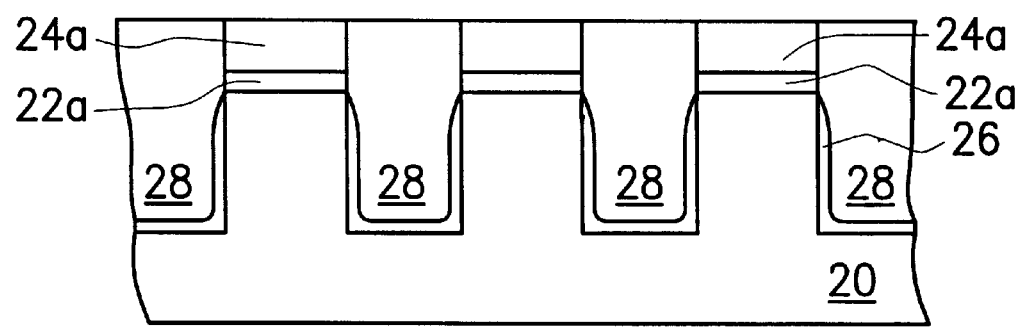

Referring to FIG. 2E, a CMP process is performed to planarize the oxide layer 28. Since the oxide layer 28 has been smoothed, possibility of pulling out the oxide layer 28 from the trench 25 is greatly reduced.

Figure 2F:
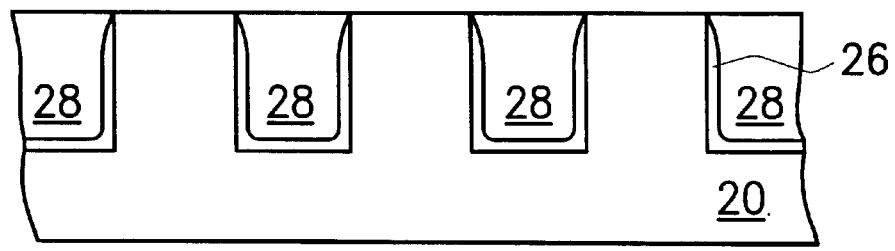

Referring to FIG. 2F, the mask layer 24a and the pad oxide layer 22a are removed by, for example, wet etching. A shallow trench isolation structure is completed.

According to the invention, since prior to performing a CMP on a HDPCVD oxide layer, a smoothing step is performed on the HDPCVD oxide layer to smooth the peak profile of the oxide layer, the moment resulting from the CMP on the peak can be reduced, and the later-formed shallow trench isolation structure is prevented from being pulled out. In addition, since the invention prevents the later-formed shallow trench isolation structure from being pulled out, the particle resulting from the oxide pulled out from the shallow trench is reduced. Thus, a particle damage on the surface of the wafer is reduced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a shallow trench isolation structure, comprising:

providing a semiconductor substrate;

forming a shallow trench in the semiconductor substrate;

forming an oxide layer by high density plasma chemical vapor deposition to cover the semiconductor substrate and to fill the shallow trench, wherein the oxide layer has a steep peak profile;

performing a smoothing step to smooth the steep peak profile;

performing a chemical mechanical polishing to planarize the oxide layer; and removing the mask layer and the pad oxide layer to complete a shallow trench isolation structure.

2. A method for forming a shallow trench isolation structure, comprising:

providing a semiconductor substrate;

forming a pad oxide layer and a mask layer on the semiconductor substrate;

patterning the mask layer, the pad oxide layer and the semiconductor substrate to form a shallow trench;

forming a liner oxide layer in the semiconductor substrate of the shallow trench;

forming an oxide layer by a high density plasma chemical vapor deposition to cover the semiconductor substrate and to fill the shallow trench, wherein the oxide layer has a steep peak profile;

performing a smoothing step to smooth the steep peak profile;

performing a chemical mechanical polishing to planarize the oxide layer; and removing the mask layer and the pad oxide layer to complete a shallow trench isolation structure.

3. The method of claim 2, wherein the smoothing step comprises a wet etching.

4. The method of claim 3, wherein an etching solution used in the wet etching is selected from a group consisting of a buffered oxide etchant and a dilute hydrogen fluoride (HF).

5. The method of claim 2, wherein the smoothing step comprises an isotropic dry etching.

6. The method of claim 5, wherein the isotropic dry etching comprises a chemical dry etching.

7. The method of claim 6, wherein operation conditions of the chemical dry etching are a chamber pressure of about 1000 mT, a flow rate of tetrafluoromethane ($CF_4$) of about 200 sccm, a flow rate of oxygen ($O_2$) of about 200 sccm, and a power of about 1400 w.

* * * * *